United States Patent
Zhu et al.

(10) Patent No.: US 8,052,881 B2
(45) Date of Patent: Nov. 8, 2011

(54) METHOD OF MANUFACTURING MULTILAYER PRINTED CIRCUIT BOARD HAVING BURIED HOLES

(75) Inventors: Yun-Li Zhu, Shenzhen (CN); Yung-Wei Lai, Taoyuan (TW); Shing-Tza Liou, Taoyuan (TW)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 781 days.

(21) Appl. No.: 12/164,422

(22) Filed: Jun. 30, 2008

(65) Prior Publication Data

US 2009/0159559 A1   Jun. 25, 2009

(30) Foreign Application Priority Data

Dec. 25, 2007 (CN) .......................... 2007 1 0203397

(51) Int. Cl.
   *H05K 13/00* (2006.01)
(52) U.S. Cl. ................ 216/13; 216/18; 216/20; 216/36; 29/831; 29/847; 29/852; 427/99.2
(58) Field of Classification Search ........................ None
   See application file for complete search history.

(56) References Cited

U.S. PATENT DOCUMENTS

| 6,753,483 | B2 * | 6/2004 | Andoh et al. | 174/262 |
| 7,178,229 | B2 * | 2/2007 | Borland et al. | 29/831 |
| 7,278,205 | B2 * | 10/2007 | Miyazaki et al. | 29/830 |
| 2009/0169808 | A1 * | 7/2009 | Takano et al. | 428/131 |
| 2011/0214906 | A1 * | 9/2011 | Baars et al. | 174/257 |

FOREIGN PATENT DOCUMENTS

CN       1337145 A     2/2002

\* cited by examiner

*Primary Examiner* — Anita Alanko
(74) *Attorney, Agent, or Firm* — Altis Law Group, Inc.

(57) ABSTRACT

A method for manufacturing a multilayer printed circuit board includes the following steps. A number of laminate units are provided. Each of the laminate units includes an electrically conductive layer with a circuit pattern defined therein, and a release layer releasably attached to the electrically conductive layer. A number of insulation layers are provided. Each of the insulation layers definies a metalized through hole therein. The electrically conductive layers and the insulation layers are stacked alternately one on another such that adjacent electrically conductive layers are insulated by one insulation layer and the metalized through holes electrically connects the circuit patterns of the adjacent electrically conductive layers. In the stacking step, the release layer is removed from the laminate unit after the electrically conductive layer is stacked onto the respective insulation layer, thereby obtaining a pre-laminated multilayer printed circuit board. The stacked electrically conductive layers and the insulation layers are laminated together to achieve a multilayer printed circuit board.

11 Claims, 8 Drawing Sheets

METHOD OF MANUFACTURING MULTILAYER PRINTED CIRCUIT BOARD HAVING BURIED HOLES

BACKGROUND

1. Field of the Invention

The present invention relates to methods for manufacturing printed circuit boards (PCBs) and, particularly, to a method for manufacturing a multilayer printed circuit board having buried holes.

2. Description of Related Art

Multilayer PCBs are composed of a number of single-sided PCBs and/or double-sided PCBs. Multilayer PCBs have holes to electrically connect adjacent traces. In order to accommodate to the integration and miniaturization of electronic components, buried holes have been designed to electrically connect adjacent traces and to reduce an area of the traces.

A conventional build-up method for manufacturing multilayer PCBs having buried holes includes the following steps. In a first step, a first single-sided PCB is provided. The first single-sided PCB includes a first insulation layer and a first circuit formed on the insulation layer. In a second step, a copper clad laminate including a second insulation layer and a copper layer is provided, and the second insulation layer of the copper clad laminate is laminated on the first circuit of the first single-sided PCB. In a third step, a second circuit is formed on the copper layer, and a first through hole communicating with the first circuit and the second circuit is also formed in the second insulation layer. Thus, a multilayer PCB having two layers of circuits is fabricated. The second and third steps are repeated and a multilayer PCB having predetermined layers of circuits is fabricated. However, regarding the above manufacturing method of the multilayer PCB, a laminating process is required to be performed in each of the repeated second steps, thereby complicates the manufacturing process.

What is need, therefore, is a method for manufacturing multilayer PCB which can overcome the above shortcomings.

SUMMARY

A method for manufacturing a multilayer printed circuit board includes the following steps. A number of laminate units are provided. Each of the laminate units includes an electrically conductive layer with a circuit pattern defined therein, and a release layer releasably attached to the electrically conductive layer. A number of insulation layers are provided. Each of the insulation layers definies a metalized through hole therein. The electrically conductive layers and the insulation layers are stacked alternately one on another such that adjacent electrically conductive layers are insulated by one insulation layer and the metalized through holes electrically connects the circuit patterns of the adjacent electrically conductive layers. In the stacking step, the release layer is removed from the laminate unit after the electrically conductive layer is stacked onto the respective insulation layer, thereby obtaining a pre-laminated multilayer printed circuit board. The stacked electrically conductive layers and the insulation layers are laminated together to achieve a multilayer printed circuit board.

Advantages and novel features will become more apparent from the following detailed description when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Embodiments will now be described in detail below and with reference to the drawings.

Figure 1:
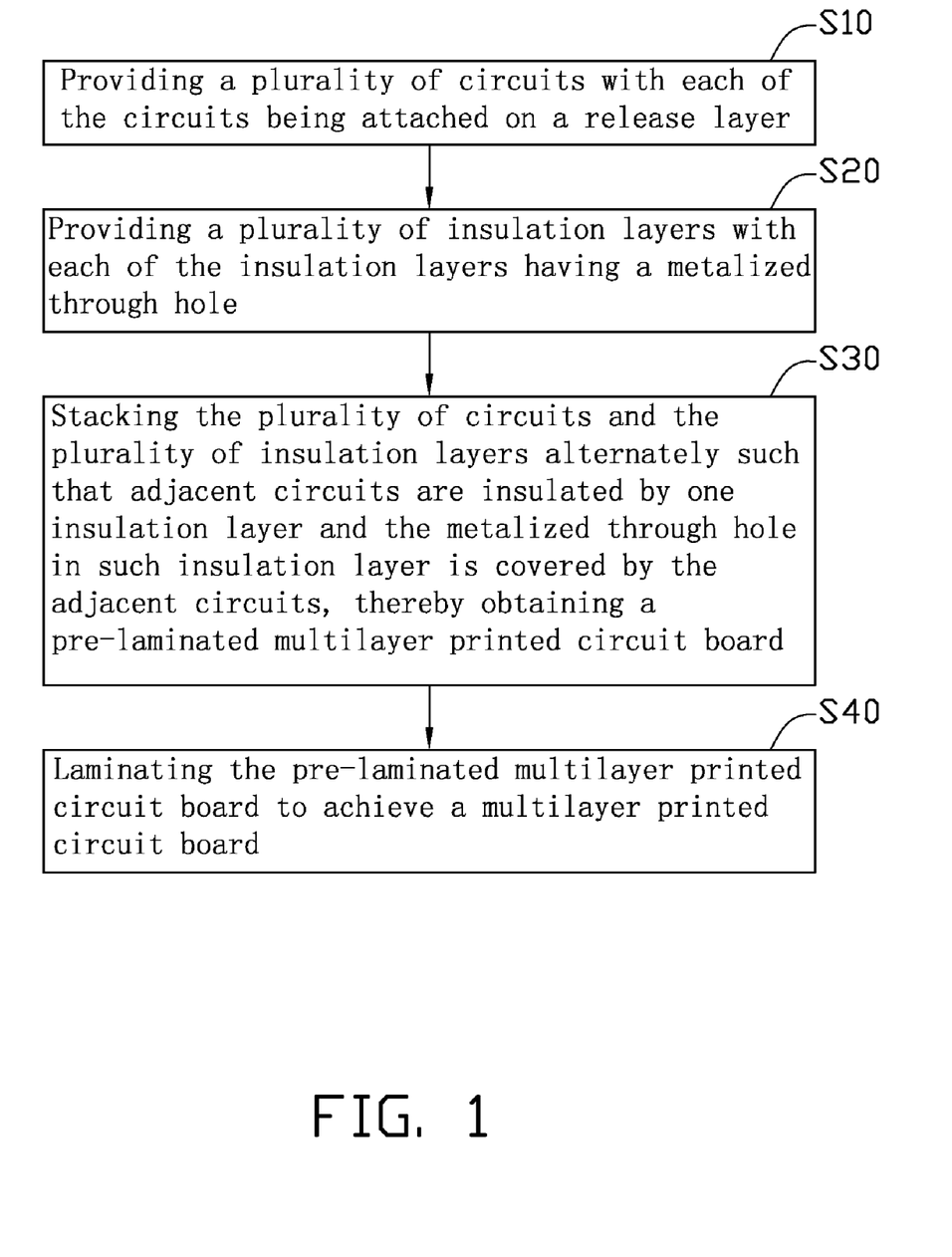
FIG. 1 is a flowchart of a process for manufacturing a multilayer printed circuit board in accordance with an exemplary embodiment.

A multilayer PCB is composed of a number of (e.g., two or more) single-layer PCBs. The multilayer PCB includes buried holes to electrically connect adjacent circuits therein. Each of the single-layer PCBs includes an insulation layer and a circuit formed on a surface of the insulation layer. A subject matter of the present embodiments for fabricating multilayer PCBS includes two main steps: alternately stacking a number of circuits and a number of insulation layers for insulating adjacent circuits together; and laminating these circuits and insulation layers together one time only (i.e., in a single process). Referring to FIG. 1, a detailed process for fabricating a multilayer PCB is recited in the following.

Figure 2:
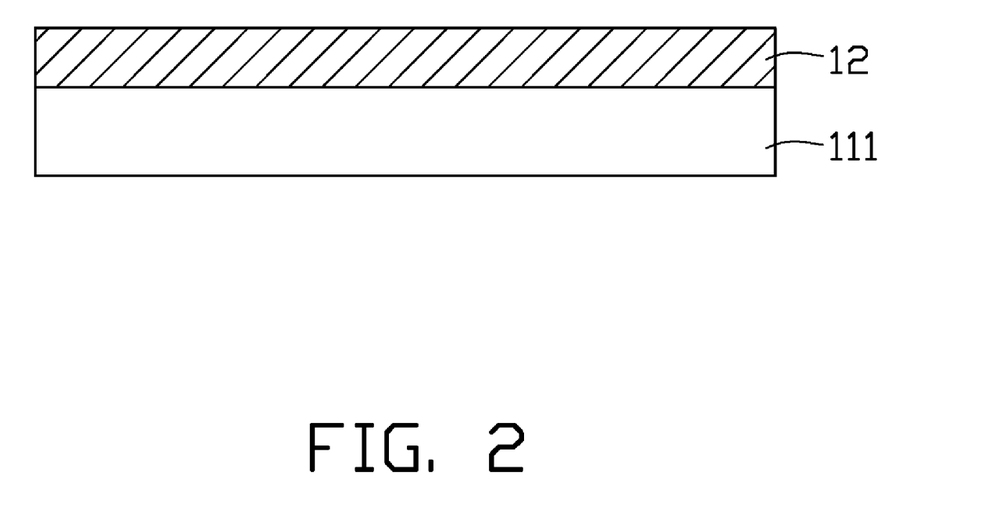
FIGS. 2~7 are schematic view of the specific steps of FIG. 1.
Figure 3:
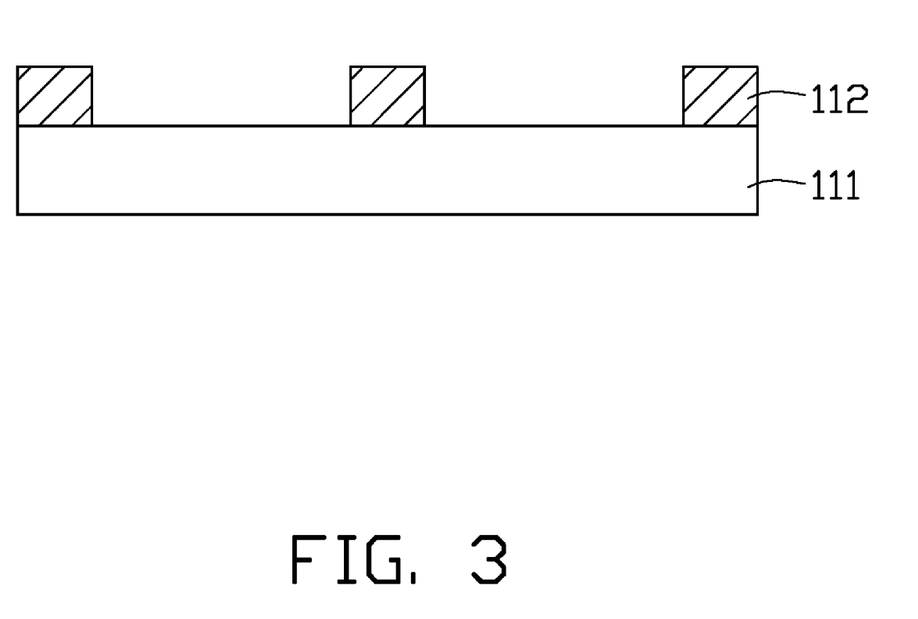

In a general step S10, a number of laminate units are provided. Each of the laminate units includes an electrically conductive layer with a circuit pattern defined therein, and a release layer releasably attached to the electrically conductive layer. Referring to FIG. 2 and FIG. 3, laminate unit includes a copper foil 12 (i.e., the electrically conductive layer) releasably attached to a release layer 111, and the copper foil 12 is made into a circuit 112 (i.e., the circuit pattern) using a chemical etching method. Thus, a circuit 112 is releasably attached to the release layer 111. In such manner, a number of circuits 112 are formed, and each of the circuits 112 is releasably attached to a corresponding release layer 111. The copper foil 12 has a micrometer-scale thickness, and is flexible and capable of being bent. The release layer 111 is used to support the copper foil 12 to prevent the copper foil 12 from rucking or crinkling. The release layer 111 is also known as a back film for strengthening or stiffening the copper foil 12, and is comprised of an insulation material with a predetermined rigidity relative to the copper foil 12, thereby capable of supporting the copper foil 12 thereon. The release layer 111 has an adhesive ability to a certain degree, which is capable of adhering the copper foil 12 to a surface of the release layer 111 and is capable of separating the copper foil 12 and the release layer 111 expediently. In the present illustrated embodiment, the release layer 111 is a polyethylene terephtalate (PET), and is adhered to the copper foil 12 by a lamination manner.

The circuit 112 is made by a chemical etching method. Because of being well-known to any person skilled in the art, the chemical etching method of manufacturing circuits is briefly described in the following. For example, a patterned photo-resist pattern is formed on a surface of the copper foil 12. According to the patterned photo-resist pattern, the copper foil 12 is etched and therefore the circuit 112 is formed.

Figure 4:
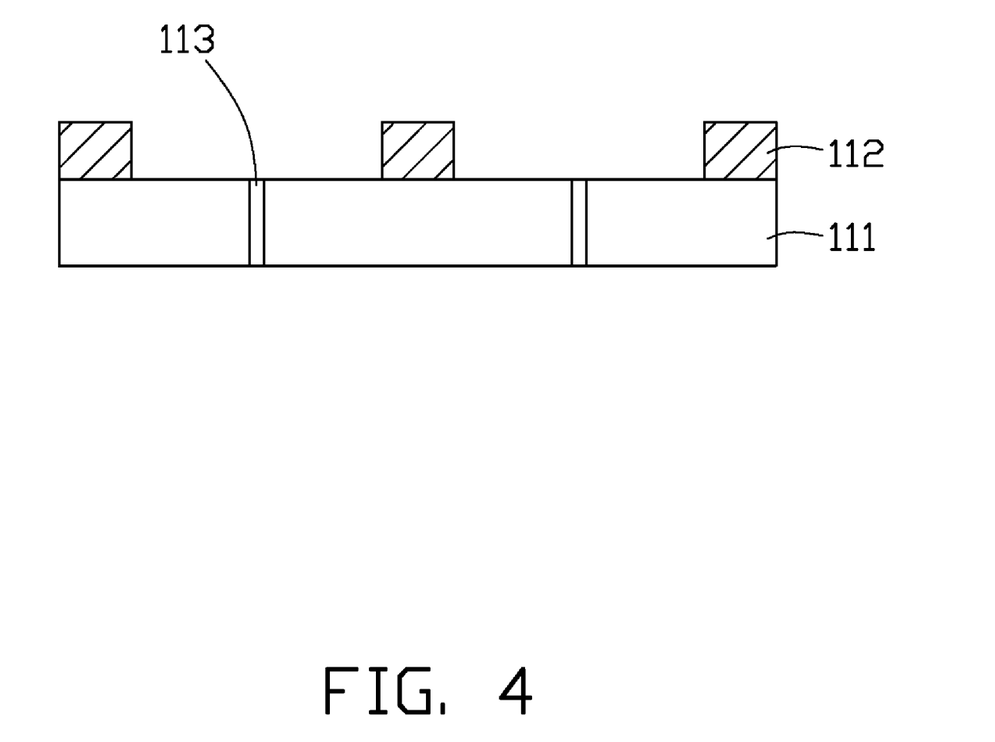

In order to align the circuits 112 in the sequential stacking and laminating process, at least a first registering hole 113 is formed in the release layer 111, as shown in FIG. 4. Upon the condition that the release layer 111 is required to be fixed on a worktable in the process of forming the circuit 112, the first registering hole 113 can be formed prior on forming the circuit 112. In this circumstance, the first registering hole 113 not only functions to fix the release layer 111 during forming the circuit 112, but also serves as a reference point for aligning the circuits 112 in the sequential stacking and laminating process. In addition, after the circuit 112 has been formed, the first registering hole 113 can be additionally formed to especially serve as the reference point for aligning the circuits 112 in the sequential stacking and laminating process.

Figure 5:
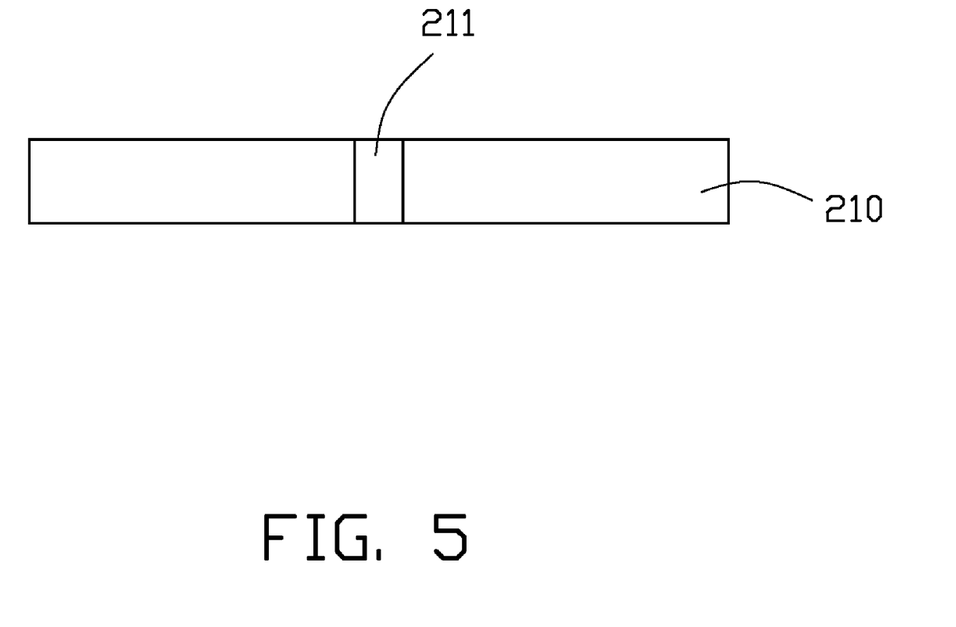
Figure 6:
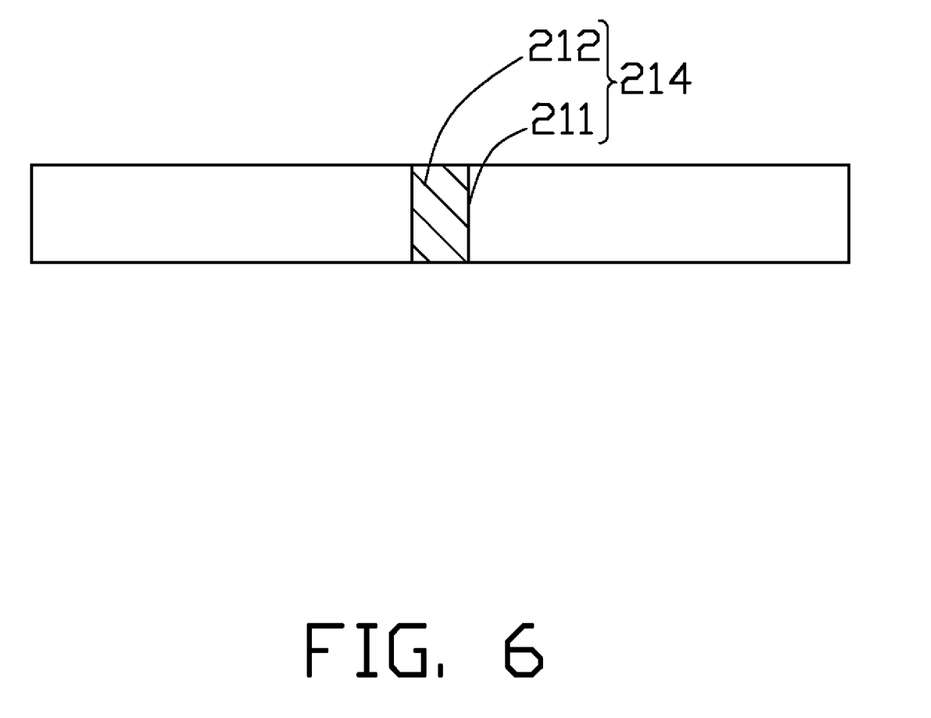

In a general step S20, a number of insulation layers are provided, and each of the insulation layers defines a metalized through hole therein. Referring to FIG. 5, an insulation layer 210 defines a through hole 211 therein. Referring to FIG. 6, the through hole 211 is metalized to be a metalized through hole 214. Thus, the insulation layers 210 with the metalized through hole 214 defined therein is formed. In such manner, a number of insulation layers 210 with each insulation layer 210 defining the metalized through hole 214 therein are manufactured.

In the present illustrated embodiment, the insulation layer 210 is a prepreg sheet. The prepreg is a semi-solidified material and is formed by immersing a glass fabric into a resin solution and semi-solidifying the wetted glass fabric. The resin solution can be bakelite, epoxy, or polytetrafluorethylene (PTFE). In the present embodiment, the glass fabric is immersed into an epoxy resin solution, and the glass fabric attaching the epoxy resin solution is semi-solidified to form a prepreg sheet. Therefore, such prepreg sheet comprised of the glass fabric and the epoxy resin is used as the insulation layer 210.

The through hole 211 can be formed in the insulation layer 210 by a mechanical drilling method, a laser bombarding method, or a chemical etching method. In order to achieve electrical connection between adjacent circuits of the multilayer PCB, the through hole 211 is required to be metalized. The through hole 211 can be metalized by means of providing electrically conductive materials in the through hole 211. For example, an electrically conductive metal layer is formed on a wall of the through hole 211, or an electrically conductive paste filled in the through hole 211. For example, the electrically conductive paste filled in the through hole 211 is a silver paste. For example, the electrically conductive metal layer formed on the wall of the through hole 211 is a copper layer.

In the present embodiment, the through hole 211 is filled with an electrically conductive paste 212 using a screen printing method, as shown in FIG. 6. Specifically, a stencil which defines a printing pattern (i.e., through holes defined in the stencil) corresponding to the through holes 211 is disposed on the surface of the insulation layer 210, and the electrically conductive paste 212 is applied on the stencil. A scraper is used to scrape the electrically conductive paste 212 passing through the printing pattern of the stencil and entering into the through hole 211. The electrically conductive paste 212 entering into the through hole 211 is then solidified and stably and reliably filled in the through hole 211, thereby the desired metalized through hole 214 (i.e., the through hole 211 filled with the electrically conductive paste 212) is formed.

Alternatively, the metalized through hole 214 is formed by a combination of an electro-plating process and an electroless-plating process. Firstly, an electroless-plating metal layer (e.g., copper layer) with a predetermined thickness is formed on the wall of the through hole 211 by an electroless-plating process. Secondly, an electro-plating metal layer is formed on the electroless-plating metal layer by an electro-plating process, thereby forming the metalized through hole 214. Because a wall of the through hole 211 is made of insulation materials, the metal layer can be easily formed on the wall of the through hole 211 by the electroless-plating process, thereby obtaining the electroless-plating metal layer. The electroless-plating metal layer firmly combines with the wall of the through hole 211. The presence of the electroless-plating metal layer facilitates the electro-plating metal layer depositing thereon.

Figure 7:
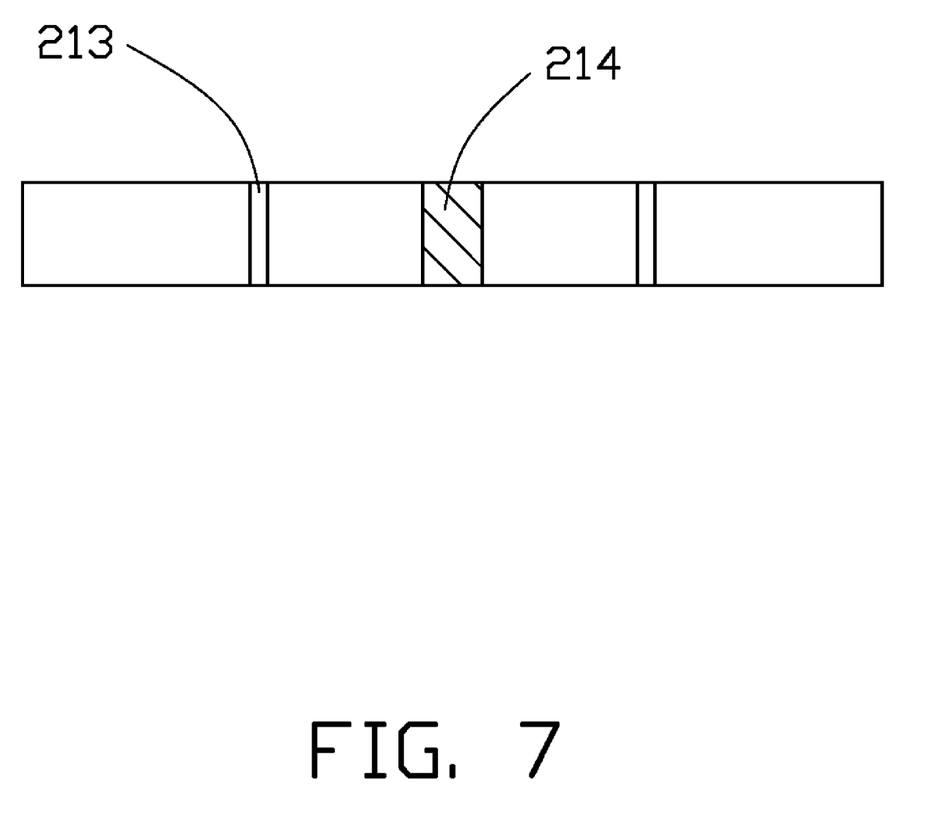

In order to align the circuits 112 in the sequential stacking and laminating process, a second registering hole 213 is formed in the insulation layer 210 while the through hole 211 is formed, as shown in FIG. 7. Upon the condition that the insulation layer 210 is required to be fixed on a worktable in the process of forming the through hole 211, the second registering hole 213 is formed prior on forming the through hole 211. In this circumstance, the second registering hole 213 not only functions to fix the insulation layer 210 during forming the through hole 211, but also serves as a reference point for aligning the circuits 112 in the sequential stacking and laminating process. In addition, after the through hole 211 has been formed, the second registering hole 213 can be additionally formed to serve as the reference point for especially aligning the circuits 112 in the sequential stacking and laminating process.

In a general step S30, a number of circuits 112 and a number of insulation layers 210 having the metalized through hole 214 are stacked alternately one on another, as a result, adjacent circuits 112 are insulated by one insulation layer 210, and the metalized through hole 214 electrically connects the adjacent circuits 112, thereby obtaining a pre-laminated multilayer printed circuit board. In detail, according to the step S10 and the step S20, a number of circuits 112 attached on the release layer 111 and a number of insulation layers 210 having the metalized through hole 214 are separately formed. According to a practical requirement, a desired multilayer PCB having predetermined layers of circuits 112 can be manufactured. For example, the desired multilayer PCB is a double-sided PCB, two circuits 112 separately attached on two release layers 111 are separately laminated on opposite surfaces of one insulation layer 210 such that two circuits 112 firmly combine with the insulation layer 210. Then two release layers 111 combining with two circuits 112 are removed and therefore the desired double-sided PCB is obtained.

Figure 8:
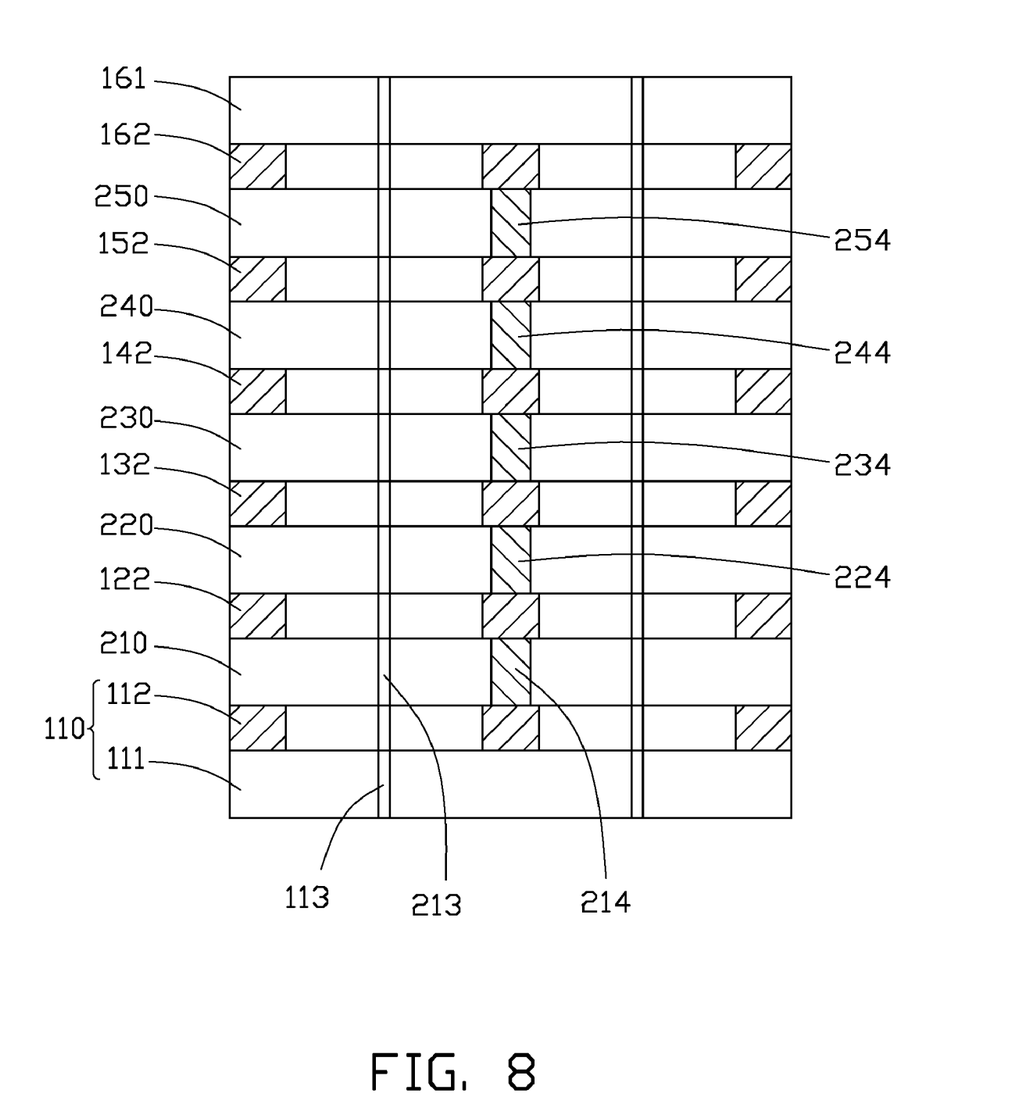
FIG. 8 is a schematic view of the multilayer printed circuit board manufactured by the process shown in FIG. 1.

Referring to FIG. 8, an exemplary embodiment of a method for fabricating a six-layer PCB (i.e., a multilayer PCB having six layers of circuits) is described in the following.

Firstly, according to the aforesaid step S10, a first circuit 112 (i.e., the aforesaid circuit 112) attached on a first release layer 111 (i.e., the aforesaid release layer 111), a second circuit 122 attached on a second release layer (not shown), a third circuit 132 attached on a third release layer (not shown), a fourth circuit 142 attached on a fourth release layer (not shown), a fifth circuit 152 attached on a fifth release layer (not shown), and a sixth circuit 162 attached on a sixth release layer 161 are provided.

Secondly, according to the aforesaid step S20, a first insulation layer 210 (i.e., the aforesaid insulation 210) with a first metalized through hole 214 (i.e., the aforesaid metalized through hole 214) defined therein, a second insulation layer 220 with a second metalized through hole 224 defined therein, a third insulation layer 230 with a second metalized through hole 234 defined therein, a fourth insulation layer 240 with a fourth metalized through hole 244 defined therein, and a fifth insulation layer 250 with a fifth metalized through hole 254 defined therein are provided. The five insulation layers 210, 220, 230, 240, 250 are prepreg sheets.

Thirdly, the six circuits 112, 122, 132, 142, 152, 162 attached on their corresponding release layer and five insulation layers 210, 220, 230, 240, 250 are alternately stacked and laminated together, respectively. In the stacking and laminating process, a fixture is required. The fixture includes a platform and a number of pins perpendicular to the platform. In order to simplify description, only one pin is recited to illustrate the stacking of the six circuits 112, 122, 132, 142, 152, 162 and the five insulation layers 210, 220, 230, 240, 250. The stacking and laminating process includes the following steps.

In a first step, the first release layer 111 with the first circuit 112 attached thereon is disposed on a surface of the platform, and the pin is inserted through the first registering hole 113 of the first release layer 111, thus the first release layer 111 is fixed on the surface of the platform.

In a second step, the first insulation layer 210 is disposed on the first circuit 112, and the pin is inserted through the first metalized through hole 214.

In a third step, the second circuit 122 attached on the second release layer is disposed and combined with a surface of the first insulation layer 210, and the second release layer is removed away from the second circuit 122. Because the first insulation layer 210 is a prepreg sheet, the second circuit 122 is combined with the first insulation layer 210 under a small pressure, e.g. the second circuit 122 is combined with the first insulation layer 210 manually. Then, the second release layer is removed away from the second circuit 122 such that the second circuit 122 is exposed to the air and the sequential second insulation layer 220 is capable of being disposed on the second circuit 122.

In a final step, the aforesaid second and third steps are repeated, the second insulation layer 220, the third circuit 132, the third insulation layer 230, the fourth circuit 142, the fourth insulation layer 240, the fifth circuit 152, the fifth insulation layer 250, and the sixth circuit 162 attached on the sixth release layer 161 are stacked on the second circuit 122, in the order written. As a result, a pre-laminated multilayer PCB having six layers of circuit is formed. In the pre-laminated multilayer PCB, the first release layer 111 and the sixth release layer 161 are separately localized at two opposite outmost layer of the pre-laminated multilayer PCB.

In a general step S40, the pre-laminated multilayer PCB is laminated by a laminator, and the first release layer 111 and the sixth release layer 161 are removed, thereby obtaining the desired six-layer PCB 100. In the laminating process, the first release layer 111 and the sixth release layer 161 both serve as a protective film and directly contact with the laminator so as to avoid the first circuit 112 and the sixth circuit 162 from being damaged or irrelevantly affected due to directly contacting with the laminator.

Regarding the obtained six-layer PCB 100, the first circuit 112 and the second circuit 122 neighboring the first circuit 112 are insulated by the first insulation layer 210, and separately cover and electrically connect with the first metalized through hole 214 in the first insulation layer 210 so as to occlude two opposite ends of the first metalized through hole 214. As a result, the first metalized through hole 214 is changed into a buried hole. Similarly, the metalized through holes in other four insulation layers also be occluded by the circuits formed on the insulation layers and therefore changed to be buried holes. In addition, because the five insulation layers 210, 220, 230, 240, 250 are prepreg sheets, the six circuits 112, 122, 132, 142, 152, 162 are partially or entirely embedded in the corresponding insulation layers after laminated. For example, the first circuit 112 and the second circuit 122 are separately combined on opposite surfaces of the first insulation layer 210, after being laminated, the first circuit 112 and the second circuit 122 are partially or entirely embedded in opposite surfaces of the first insulation layer 210 separately. Therefore, in the six-layer PCB 100, each of the six circuits 112, 122, 132, 142, 152, 162 are partially or entirely embedded in the corresponding insulation layers. Furthermore, in the six-layer PCB 100, the five buried holes 214, 224, 234, 244, 254 (i.e., five metalized through holes 214, 224, 234, 244, 254) communicate with each other. It is to be understood that the above five buried holes can be arranged according to a practical requirement, e.g., do not communicate with each other.

It is noted that the number of layers of the multilayer PCB can be predetermined according to the practical requirement. In the multilayer PCB, each layer of the circuits is partially or entirely embedded in the corresponding insulation layers. The buried holes in the multilayer PCB can communicate with each other.

Regarding the aforesaid method for fabricating the multilayer PCB, a number of circuits and a number of insulation layers for insulating each adjacent circuits are stacked and laminated together one time only. This method just require once laminating process so as to greatly simplify the manufacture process and effectively improve a manufacture efficiency, thereby facilitating a mass-producing of the multilayer PCBS.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for manufacturing a multilayer printed circuit board, the method comprising:
    providing a plurality of laminate units, each of the laminate units including an electrically conductive layer with a circuit pattern defined therein, and a release layer releasably attached to the electrically conductive layer;
    providing a plurality of insulation layers, each of the insulation layers defining a metalized through hole therein;
    stacking the electrically conductive layers and the insulation layers alternately one on another such that adjacent electrically conductive layers are insulated by one insulation layer and the metalized through holes electrically connects the circuit patterns of the adjacent electrically conductive layers, and removing the release layer from the laminate unit after the electrically conductive layer being stacked onto the respective insulation layer, thereby obtaining a pre-laminated multilayer printed circuit board; and
    laminating the stacked electrically conductive layers and the insulation layers together to achieve a multilayer printed circuit board.

2. The method as claimed in claim 1, wherein after laminating the pre-laminated multilayer printed circuit board, the release layer located at the outermost of the pre-laminated multilayer printed circuit board is removed.

3. The method as claimed in claim 1, wherein each of the insulation layers is a prepreg sheet.

4. The method as claimed in claim 1, wherein before the stacking step, a first registering hole is formed in each of the release layers, and a second registering hole corresponding to the first registering hole is formed in each of the insulation layers.

5. The method as claimed in claim 4, wherein the first registering hole and the second registering hole are formed using one of a chemical etching method, a laser bombarding method and a mechanical drilling method.

6. The method as claimed in claim 1, wherein the metalized through hole is formed using a combination of an electroless-plating process and an electro-plating process.

7. A method for manufacturing a multilayer printed circuit board, the method comprising:
   in a first step, disposing a first release layer with a first circuit layer attached thereon on a surface of a platform such a manner that the first release layer faces the surface of the platform;
   in a second step, disposing an insulation layer having a metalized through hole therein on the first circuit layer;
   in a third step, combining a second circuit layer with a second release layer attached thereon with an opposite side of the insulation layer to the first circuit layer, and removing the second release layer from the second circuit layer;
   repeating the second and third steps to obtain a plurality of stacked circuit layers and insulation layers; and
   laminating the stacked circuit layers and the insulation layers together to obtain a multilayer printed circuit board.

8. The method as claimed in claim 7, wherein in the second step, the metalized through hole defined in the insulation layer is covered and electrically connected to the first circuit layer.

9. The method as claimed in claim 7, wherein in the third step, the metalized through hole defined in the insulation layer is covered and electrically connected with the second circuit layer.

10. The method as claimed in claim 7, wherein each of the insulation layers is a prepreg sheet.

11. The method as claimed in claim 7, wherein after the laminating step, all the release layers are removed.

* * * * *